United States Patent [19]
Thomsen et al.

[11] Patent Number: 5,596,589
[45] Date of Patent: Jan. 21, 1997

[54] METHOD AND APPARATUS FOR ENCODING AND DECODING ERROR CORRECTION CODES IN A RADIO COMMUNICATION SYSTEM

[75] Inventors: Soeren H. Thomsen, Aarre, Denmark; Charles A. Sherwood, II, Naperville; Casimir Karczewski, Lake Villa, both of Ill.

[73] Assignee: Motorola, Inc., Schaumburg, Ill.

[21] Appl. No.: 143,229

[22] Filed: Oct. 29, 1993

[51] Int. Cl.$^6$ .................................................. G06F 11/10
[52] U.S. Cl. .................................... 371/37.8; 371/37.1
[58] Field of Search .............................. 371/37.8, 37.1, 371/37.6

[56] References Cited

U.S. PATENT DOCUMENTS

| | | | |
|---|---|---|---|
| 4,468,769 | 8/1984 | Kogu | 371/37 |
| 4,564,944 | 1/1986 | Arnold | 371/37 |
| 4,567,594 | 1/1986 | Deodhar | 371/40.1 |
| 4,599,722 | 7/1986 | Mortimer | 371/37.1 |
| 4,644,543 | 2/1987 | Davis | 371/37 |
| 4,675,869 | 6/1987 | Driessen | 371/37 |
| 4,893,312 | 1/1990 | Cogley | 371/37 |
| 4,958,349 | 9/1990 | Tanner et al. | 371/37.1 |
| 5,010,554 | 4/1991 | Bechtel et al. | 371/37.1 |
| 5,040,179 | 8/1991 | Carson | 371/37.1 |

OTHER PUBLICATIONS

"Decoding Techniques for Binary BCH Codes", Chapter Five pp. 137–149.
"Error–Control Techniques for Digital Communication", Arnold M. Michelson, Allen H. Levesque, Copyright 1985 by John Wiley & Sons, Inc., pp. 109–136.

*Primary Examiner*—Roy N. Envall, Jr.
*Assistant Examiner*—Cameron H. Tousi
*Attorney, Agent, or Firm*—Kelly A. Gardner; John H. Moore

[57] ABSTRACT

A communication device (140) for receiving and decoding a codeword of predetermined length, wherein the codeword includes information and parity bits, comprises a memory (315) for storing the codeword in the form of segments, wherein each segment comprises multiple bits forming bit combinations. A first look-up table (326, 327, 328, 329) included in the communication device (140) stores parity vectors corresponding to the bit combinations, and a second look-up table (325) stores values corresponding to syndrome vectors. A processing unit (310) coupled to the memory (315) and the first and second look-up tables (325–329) uses the bit combinations of the segments as indices into the first look-up table (326–329) to locate corresponding parity vectors, adds the corresponding parity vectors using modulo 2 arithmetic to form a resulting syndrome, and uses the resulting syndrome as an index into the second look-up table (325) to locate an erroneous bit included in the codeword. In similar manner, the communication device (140) can encode parity bits into the codeword using the reduced-processing method.

21 Claims, 6 Drawing Sheets

METHOD AND APPARATUS FOR ENCODING AND DECODING ERROR CORRECTION CODES IN A RADIO COMMUNICATION SYSTEM

FIELD OF THE INVENTION

This invention relates in general to error correction in radio communication systems, and more specifically to a method and apparatus for encoding and decoding error correction codes.

BACKGROUND OF THE INVENTION

Many conventional radio communication systems, such as paging systems, comprise a terminal/controller for gathering information and a plurality of base stations coupled thereto for receiving the gathered information and subsequently transmitting the information at a predetermined radio frequency over predetermined geographic areas. Thereafter, portable radio devices included in the system receive and decode the radio frequency signals to recover therefrom the transmitted information. This information can thereafter be presented to a user in a variety of ways. A portable device may, for example, use a display to visibly present information or a transducer to audibly present information. However, during transmission both to and from the base station, errors can occur in the information due to fading of the signal or due to interference. When this occurs, the user of the portable device may be presented with erroneous information, i.e., incorrect messages.

In digital communication systems, error correction techniques have been developed by which a base station can detect and correct a limited number of errors in each codeword of information provided thereto by the terminal/controller. In systems which use these error correction techniques, the terminal/controller typically generates parity information associated with and dependent on the message information included in each codeword of information. The amount of parity information which is included determines the number of errors which a base station will be able to subsequently detect and correct prior to forwarding the information to the portable radio devices. When the base station receives the signal, the parity information and the message information is recovered for each codeword. Thereafter, the parity information is used to verify and correct, if possible, the message information for each codeword. The message information is then encoded using a well known paging format and transmitted to the portable devices as a radio frequency signal.

Error correction techniques, however, generally require that each bit of each received codeword be processed individually using known error correction algorithms to verify the bit of information. As a result, conventional error correction techniques are usually very processor intensive, i.e., very time consuming. As a result, the amount of data which can be quickly processed and forwarded for transmission from the base stations to the portable devices is limited by the time required for error correcting the data. This is very undesirable because the transmission of information to portable devices, and therefore to the users, can be delayed.

Thus, what is needed is a method and apparatus for reducing the processing time necessary for error correction of information in a radio communication system.

SUMMARY OF THE INVENTION

A method, in a communication device for receiving data, for decoding a codeword of predetermined length which has been previously encoded with parity bits and information bits, comprises the step of dividing the codeword into segments, wherein the segments comprise multiple bits forming bit combinations. The method further comprises the steps of using the bit combinations as indices to locate parity vectors corresponding to the bit combinations, adding the parity vectors using modulo 2 arithmetic to form a resulting syndrome, and using the resulting syndrome as an index to locate a corresponding value indicative of an erroneous bit included in the codeword.

A communication device for receiving and decoding a codeword of predetermined length, wherein the codeword includes information and parity bits, comprises a memory for storing the codeword in the form of segments, wherein each segment comprises multiple bits forming bit combinations. A first look-up table included in the communication device stores parity vectors corresponding to the bit combinations, and a second look-up table stores values corresponding to syndrome vectors. A processing unit coupled to the memory and the first and second look-up tables uses the bit combinations of the segments as indices into the first look-up table to locate corresponding parity vectors, adds the corresponding parity vectors using modulo 2 arithmetic to form a resulting syndrome, and uses the resulting syndrome as an index into the second look-up table to locate an erroneous bit included in the codeword.

Additionally, a communication device for encoding a codeword of predetermined length, wherein the codeword includes information and parity bits, comprises a memory for storing digital data in the form of segments, wherein each segment comprises multiple bits forming bit combinations. A look-up table included in the communication device stores parity vectors corresponding to the bit combinations. A processing unit coupled to the memory and the look-up table uses the bit combinations of the segments as indices into the look-up table to locate corresponding parity vectors, adds the corresponding parity vectors using modulo 2 arithmetic to form a resulting syndrome, and appends the resulting syndrome to the digital data to form the codeword.

DESCRIPTION OF A PREFERRED EMBODIMENT

Figure 1:
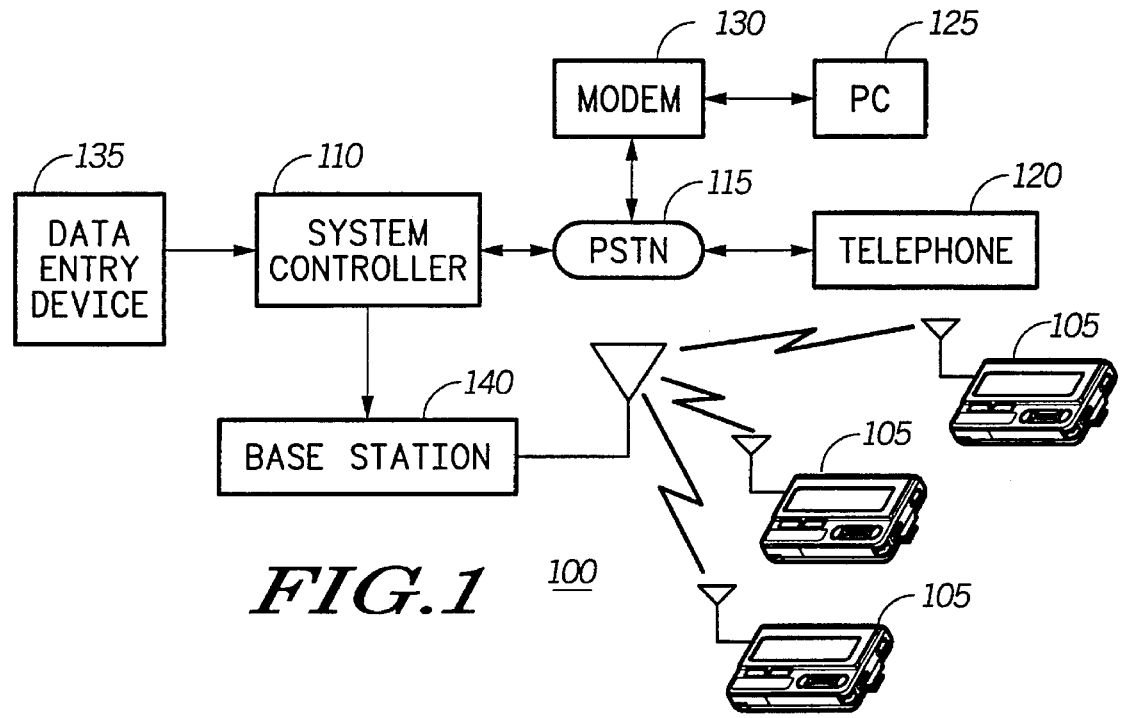
FIG. 1 is a block diagram of a radio communication system in accordance with a preferred embodiment of the present invention.

FIG. 1 is a diagram depicting a radio communication system 100, such as a cordless telephone or paging system, for transmitting information to portable radio devices 105. In accordance with the present invention, the radio communication system 100 comprises a system controller 110 for receiving message information from different sources. For example, the system controller 110 can be coupled to a conventional telephone system, such as the public switched telephone network (PSTN) 115, for receiving message information thereover from conventional wired telephone sets 120. The system controller 110 can also receive message information from other devices, such as personal computers 125 via a modem 130. Additionally, a data entry device 135 can be coupled to the system controller 110 for directly entering data such as billing information for subscribers.

The system controller 110 is also coupled to at least one base station 140 for transmitting the gathered information thereto over a communication link. Other information, e.g., addresses of targeted portable devices 105, can be provided to the base station as well. The communication link coupling the base station 140 to the system controller 110 can be, for instance, a radio frequency (RF) communication link or a wireline link. Upon reception of information from the system controller 110, the base station 140 processes and subsequently encodes the message information using a well known format, such as the POCSAG (Post Office Code Standardization Advisory Group) signalling format. The encoded information is thereafter transmitted as an RF signal which is received by the portable devices 105 that are within range of the base station 140 and targeted for reception.

Because errors often occur during transmission of the message information from both the system controller 110 and the base station 140, error correction techniques have been developed which allow the receiving device, e.g., the base station 140 or the portable device 105, to verify and correct information provided thereto. Conventionally, when error correction techniques are utilized, parity information is derived from and appended to message information to form a codeword of a predetermined length. The codeword is then transmitted from the transmitting device and received by the receiving device, which subsequently employs the parity information to detect and correct, if possible, errors in the message information for that codeword.

BCH (Bose, Chaudhuri, Hocquengem) codes are one type of error correction code. BCH and other block codes are usually described in terms of the ratio of their length n to the number of information bits k contained in the code. The remaining n–k bits are the parity bits provided to allow error detection and/or correction of the codeword. A (31, 26) code, for example, includes twenty-six (26) bits of information per codeword and five (5) bits of parity information. The parity bits are generated by performing mathematical operations on the information bits using predetermined algorithms. The process of forming parity bits is called "encoding".

A BCH code or any other cyclic code can be encoded by first multiplying the information polynomial i(x) by $x^r$, where r=n–k, then dividing by a predetermined generator polynomial g(x) using modulo 2 arithmetic, i.e., exclusive-or operations. The remainder is used as the parity information of n–k bits and is added to the information bits to form the complete codeword. This process is defined in the equation:

$$c(x)=[x^r i(x) \bmod g(x)]+x^r i(x) \qquad (1)$$

The resultant codewords are of the form:

$$c(x)=C_{n-1}x^{n-1}+c_{n-2}x^{n-2}+\ldots +c_2 x^2+c_1 x +c_0 x^0 \qquad (2)$$

The generator polynomial g(x) for the (31, 26) code is given as $g(x)=x^5+x^2+1$, or in vector form as 100101. If, for instance, the information pattern of received message information is 01001000111000110110101101, which is 26 bits long, the codeword is created by first augmenting the information pattern with five zeros and dividing, modulo 2, by the generator polynomial, as shown below:

```
100101 ⌐01001000111000110110101101100000
        100101
         101110
         100101
          101100
          100101
           100111
           100101
            100110
            100101
             111011
             100101
             111100
             100101
              110011
              100101
              101100
              100101
               100100
               100101
                00100
```

The five bit remainder of this division, which is 00100, is the parity information, and it is appended to the information pattern to form a complete codeword vector of 01001000111000110110101101100100. The leading zero in this vector is the coefficient of the $c_{n-1}$ ($c_{30}$ for this code) term in the polynomial form of the codeword, and it is usually the first bit transmitted over the channel.

A more practical way to generate the parity information for different information patterns is to use the generator matrix rather the generator polynomial. The encoded codeword is then found by multiplying the information vector times the generator matrix using modulo 2 mathematics. The generator matrix G comprises a k×k identity matrix $I_k$ and a k×(n–k) parity matrix P. The general form of the generator matrix is shown below:

$$G = \begin{bmatrix} g1 \\ g2 \\ g3 \\ . \\ . \\ . \\ gk \end{bmatrix} = \begin{bmatrix} 1 & 0 & 0 & 0 & \ldots & 0, p1 \\ 0 & 1 & 0 & 0 & \ldots & 0, p2 \\ 0 & 0 & 1 & 0 & \ldots & 0, p3 \\ . & & & & & . \\ . & & & & & . \\ . & & & & & . \\ 0 & 0 & 0 & 0 & & 1, pk \end{bmatrix} = [I_k; P]$$

The parity bits of the generator matrix are found by treating each row of the identity matrix as a code vector and dividing, modulo 2, by the generator polynomial as described above. The generator matrix for the (31, 26) code is shown below:

```
                  CODE VECTORS OF                 PARITY
                  IDENTITY MARK                   BITS    ROW
          ⎡ 10000000000000000000000000,          10010     30 ⎤
          ⎢ 01000000000000000000000000,          01001     29 ⎥
          ⎢ 00100000000000000000000000,          10110     28 ⎥
          ⎢ 00010000000000000000000000,          01011     27 ⎥
          ⎢ 00001000000000000000000000,          10111     26 ⎥
          ⎢ 00000100000000000000000000,          11001     25 ⎥
          ⎢ 00000010000000000000000000,          11110     24 ⎥
          ⎢ 00000001000000000000000000,          01111     23 ⎥
          ⎢ 00000000100000000000000000,          10101     22 ⎥
          ⎢ 00000000010000000000000000,          11000     21 ⎥
          ⎢ 00000000001000000000000000,          01100     20 ⎥
          ⎢ 00000000000100000000000000,          00110     19 ⎥
G(31,26) = ⎢ 00000000000010000000000000,          00011     18 ⎥
          ⎢ 00000000000001000000000000,          10011     17 ⎥
          ⎢ 00000000000000100000000000,          11011     16 ⎥
          ⎢ 00000000000000010000000000,          11111     15 ⎥
          ⎢ 00000000000000001000000000,          11101     14 ⎥
          ⎢ 00000000000000000100000000,          11100     13 ⎥
          ⎢ 00000000000000000010000000,          01110     12 ⎥
          ⎢ 00000000000000000001000000,          00111     11 ⎥
          ⎢ 00000000000000000000100000,          10001     10 ⎥
          ⎢ 00000000000000000000010000,          11010     09 ⎥
          ⎢ 00000000000000000000001000,          01101     08 ⎥
          ⎢ 00000000000000000000000100,          10100     07 ⎥
          ⎢ 00000000000000000000000010,          01010     06 ⎥
          ⎣ 00000000000000000000000001,          00101     05 ⎦
```

The rows of the generator matrix have been numbered in accordance with equation (2) above, which is the standard notation for the code vector $c(x)$. The identity portion of the matrix simply returns the information portion of the code vector when the multiplication is carried out.

If, for instance, the information pattern 01001000111000110110101101 is received, the information portion of the code vector can be given by:

$$c(x) = x^{29} + x^{26} + x^{22} + x^{21} + x^{20} + x^{16} + x^{15} + x^{13} + x^{12} + x^{10} + x^8 + x^7 + x^5,$$

where the powers of x correspond to bit positions of the final codeword as well as rows of the generator matrix. To form the final codeword, all that is needed is to sum, modulo 2, the rows of the generator matrix that correspond to the non-zero terms of the information portion of the code vector. This summation is illustrated below:

| GENERATOR MATRIX | | ROW |
|---|---|---|
| 01000000000000000000000000, | 01001 | 29 |
| 00001000000000000000000000, | 10111 | 26 |
| 00000001000000000000000000, | 10101 | 22 |
| 00000000100000000000000000, | 11000 | 21 |
| 00000000001000000000000000, | 01100 | 20 |
| 00000000000001000000000000, | 11011 | 16 |
| 00000000000000010000000000, | 11111 | 15 |

| GENERATOR MATRIX | | ROW |
|---|---|---|
| 00000000000000000100000000, | 11100 | 13 |
| 00000000000000000010000000, | 01110 | 12 |
| 00000000000000000000100000, | 10001 | 10 |
| 00000000000000000000001000, | 01101 | 08 |
| 00000000000000000000000100, | 10100 | 07 |
| 00000000000000000000000001, | 00101 | 05 |
| 01001000111000110110101101, | 00100 = | CODEWORD |

Figure 2:
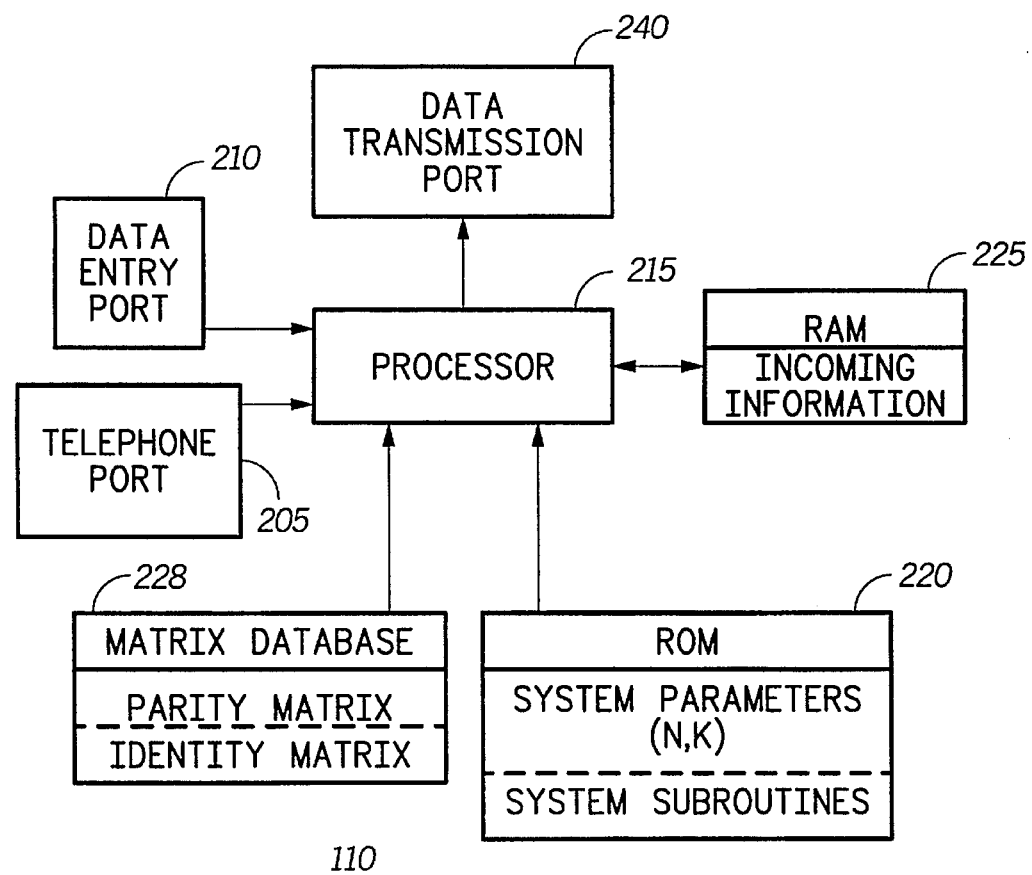
FIG. 2 is an electrical block diagram of a system controller included in the radio communication system of FIG. 1 for generating codewords which include error correction information in accordance with the preferred embodiment of the present invention.

Referring next to FIG. 2, a block diagram of the system controller 110 is depicted. The system controller 110 preferably comprises a telephone port 205 for receiving information from the PSTN 115 (FIG. 1) or other telephone network and a data entry port 210 for receiving information entered via the data entry device 135. These incoming information ports 205, 210 are coupled to a processor 215 for controlling the operation of the system controller 110.

Preferably, the system controller 110 further comprises a memory, such as a read only memory (ROM) 220, coupled to the processor 215 for storing system subroutines and system parameters. The parameters can be, for instance, the lengths of information patterns and complete codewords which are formed in response to error correction algorithms. For instance, when a (n, k) BCH code is used by the system controller 110, a first parameter, n, specifying a codeword length is stored, and second parameter, k, specifying the number of bits of information, i.e., an information pattern, included in the codeword is stored. For illustrative purposes, a (31, 26) BCH code has been utilized in the following examples. One subroutine that could be stored by the ROM 220 is an information encoding subroutine for generating the codewords which include both information and parity bits. It will be appreciated that other parameters and subroutines can be stored in the ROM 220 as well. Additionally, another memory, such as a random access memory (RAM) 225 is coupled to the processor 215 for storing incoming information and variables derived during operation of the system controller 110.

The system controller 110 further comprises a matrix database 228 for storing the parity matrix and identity matrix described above for use in generating the codewords. Once codewords are formed by the processor 215, each codeword is provided to a data transmission port 240 coupled to the processor 215 for transmitting information to the base station 140. The data transmission port 240 can be, for example, an RF transmission port when the system controller 110 and the base station 140 are coupled via an RF link, or a modem device when the communication link between the system controller 110 and the base station 140 is a wireline link.

Conventionally, the decoding operations at a base station coupled to the system controller 110 are very similar to the encoding operations. As the bits are received, a syndrome vector, which is very similar to a parity vector, is created and initially set to zero. The received information is then decoded with reference to the following table:

TABLE 1

PARITY VECTOR LOOK-UP TABLE

| BIT NO. | PARITY VECTOR |
|---|---|
| 30 | 10010 |
| 29 | 01001 |
| 28 | 10110 |

TABLE 1-continued

PARITY VECTOR LOOK-UP TABLE

| BIT NO. | PARITY VECTOR |
|---|---|
| 27 | 01011 |
| 26 | 10111 |
| 25 | 11001 |
| 24 | 11110 |
| 23 | 01111 |
| 22 | 10101 |
| 21 | 11000 |
| 20 | 01100 |
| 19 | 00110 |
| 18 | 00011 |
| 17 | 10011 |
| 16 | 11011 |
| 15 | 11111 |
| 14 | 11101 |
| 13 | 11100 |
| 12 | 01110 |
| 11 | 00111 |
| 10 | 10001 |
| 09 | 11010 |
| 08 | 01101 |
| 07 | 10100 |
| 06 | 01010 |
| 05 | 00101 |
| 04 | 10000 |
| 03 | 01000 |
| 02 | 00100 |
| 01 | 00010 |
| 00 | 00001 |

When the information is received from the system controller 110, each bit of the information is examined to determine whether the bit is even (zero) or odd (one). For each odd bit in the information, the syndrome vector is used as an index into the above table to locate the corresponding parity vector, which is added, modulo 2, to the syndrome. This operation is carried out for all thirty-one bits in each received codeword. After completion of the operation, no errors are present in the received codeword if the resulting syndrome is equal to zero. Otherwise, when the resulting syndrome is not equal to zero, the syndrome is used as an index into the following table to determine which bit is in error. That bit is then complemented to correct the received codeword.

TABLE 2

INVERSE LOOK-UP TABLE

| BIT NO. | PARITY VECTOR |
|---|---|
| NONE | 00000 |
| 00 | 00001 |
| 01 | 00010 |
| 18 | 00011 |
| 02 | 00100 |
| 05 | 00100 |
| 05 | 00101 |
| 19 | 00110 |
| 11 | 00111 |
| 03 | 01000 |
| 29 | 01001 |
| 06 | 01010 |
| 27 | 01011 |
| 20 | 01100 |
| 08 | 01101 |
| 12 | 01110 |
| 23 | 01111 |
| 04 | 10000 |
| 10 | 10001 |
| 30 | 10010 |

TABLE 2-continued

INVERSE LOOK-UP TABLE

| BIT NO. | PARITY VECTOR |
|---|---|
| 17 | 10011 |
| 07 | 10100 |
| 07 | 10100 |
| 22 | 10101 |
| 28 | 10110 |
| 26 | 10111 |
| 21 | 11000 |
| 25 | 11001 |
| 09 | 11010 |
| 16 | 11011 |
| 13 | 11100 |
| 14 | 11101 |
| 24 | 11110 |
| 15 | 11111 |

By way of example, let the codeword transmitted by the system controller 110 be equal to 01001000111000110110101101100100, and let the received codeword be equal to 01001000111010110110101101100100. In this situation, the eighteenth bit, which is highlighted, is erroneous. The calculation of the resulting syndrome is shown below, where, for each non-zero bit, the corresponding parity vector has been added, modulo 2, to the running syndrome.

| CODE BIT | BIT NO. | PARITY (SYNDROME) VECTOR | RUNNING SYNDROME |
|---|---|---|---|
| 0 | 30 | 10010 | 00000 |
| 1 | 29 | 01001 | 01001 |
| 0 | 28 | 10110 | 01001 |
| 0 | 27 | 01011 | 01001 |
| 1 | 26 | 10111 | 11110 |
| 0 | 25 | 11001 | 11110 |
| 0 | 24 | 11110 | 11110 |
| 0 | 23 | 01111 | 11110 |
| 1 | 22 | 10101 | 01011 |
| 1 | 21 | 11000 | 10011 |
| 1 | 20 | 01100 | 11111 |
| 0 | 19 | 00110 | 11111 |
| 1 | 18 | 00011 | 11100 |
| 0 | 17 | 10011 | 11100 |
| 1 | 16 | 11011 | 00111 |
| 1 | 15 | 11111 | 11000 |
| 0 | 14 | 11101 | 11000 |
| 1 | 13 | 11100 | 00100 |
| 1 | 12 | 01110 | 01010 |
| 0 | 11 | 00111 | 01010 |
| 1 | 10 | 10001 | 11011 |
| 0 | 09 | 11010 | 11011 |
| 1 | 08 | 01101 | 10110 |
| 1 | 07 | 10100 | 00010 |
| 0 | 06 | 01010 | 00010 |
| 1 | 05 | 00101 | 00111 |
| 0 | 04 | 10000 | 00111 |
| 0 | 03 | 01000 | 00111 |
| 1 | 02 | 00100 | 00011 |
| 0 | 01 | 00010 | 00011 |
| 0 | 00 | 00001 | 00011 |
|  |  |  | RESULTING SYNDROME |

The resulting syndrome is then located in the inverse look-up table to determine which bit is in error. Because the resulting syndrome 00011 corresponds to the eighteenth bit of the codeword, the eighteenth bit is in error and can be complemented to correct the codeword.

This conventional decoding method works well; however, the method requires a large amount of processing time because each individual bit of each incoming codeword must be examined before referencing the look-up table to discover the corresponding syndronme. Additionally, a running syndrome must be re-calculated for each non-zero bit to create the resulting syndrome, which is then used to correct the codeword, if necessary. This large amount of processing time can easily introduce delays in forwarding the information from a conventional base station to the portable devices 105 (FIG. 1) included in the radio communication system 100. As a result, the speed with which a conventional base station can provide information to the portable devices 105 is limited by the decoding proccess.

Figure 3:
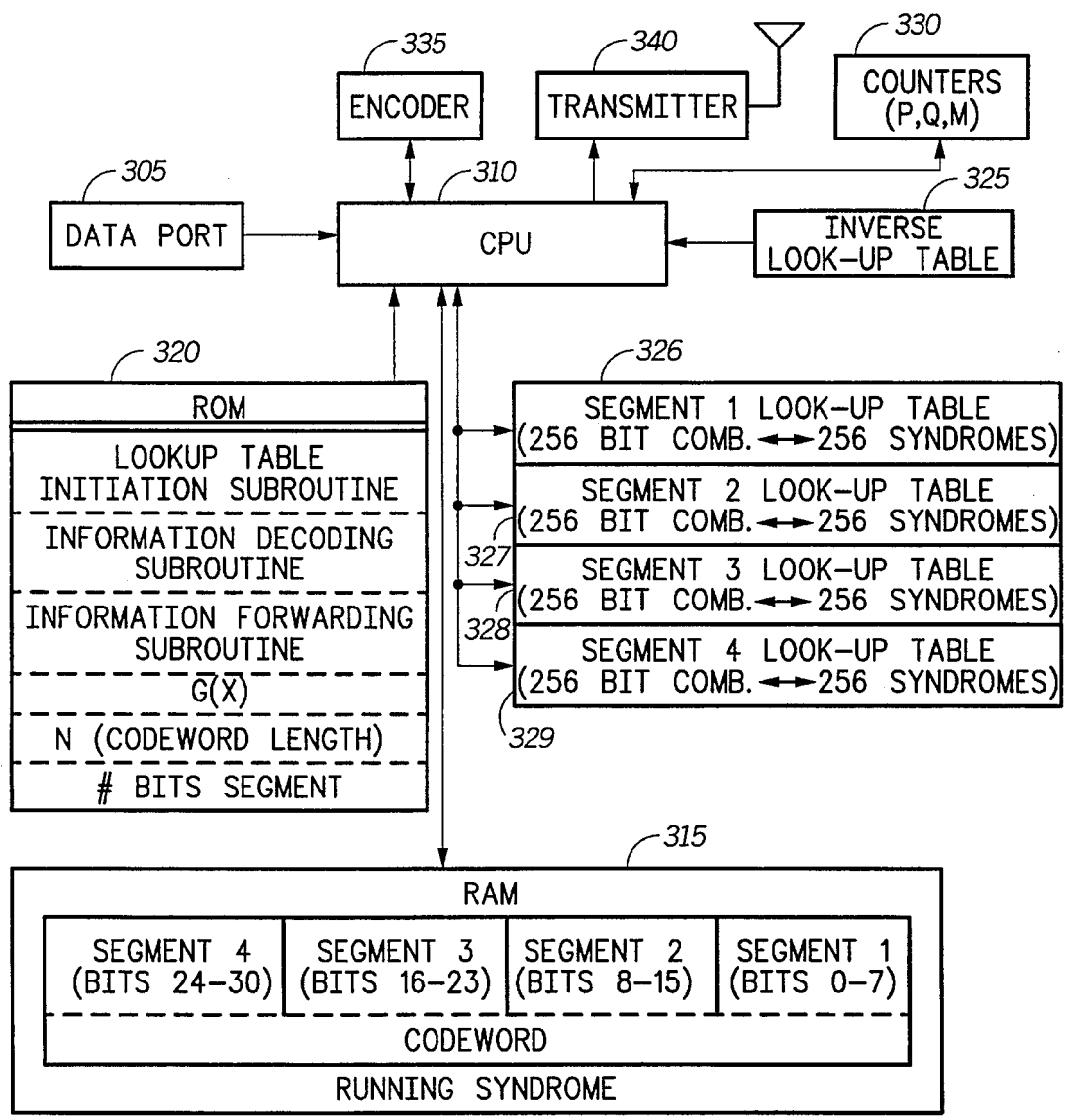
FIG. 3 is an electrical block diagram of a base station included in the radio communication system of FIG. 1 for decoding the codewords generated by the system controller of FIG. 2 in accordance with the preferred embodiment of the present invention.

Referring next to FIG. 3, an electrical block diagram of a communication device for receiving and decoding codeword information in accordance with the present invention is depicted. The communication device, in accordance with the preferred embodiment of the present invention, is a base station 140 for receiving and subsequently retransmitting information. The base station 140 comprises a data port 305 which, as described above, can be coupled to the system controller 110 (FIG. 1) by an RF link or a wireline link. When a wireline communication link is employed, the data port 305 can comprise a modem device for generating from the incoming signals a digital data stream. When the communication link is an RF link the data port 305 can comprise a conventional RF receiver for receiving a signal and recovering therefrom digital data, which is provided to a central processing unit (CPU) 310 for controlling the operation of the base station 140.

Further included in the base station 140 is a memory, such as random access memory (RAM) 315, for storing the incoming data and for storing other variables derived during operation of the base station 140. Another memory, such as a read, only memory (ROM) 320, is preferably coupled to the CPU 310 for storing system parameters, e.g., a codeword length n and a generator polynomial g(x), and subroutines executed by the CPU 310. The subroutines can be, for example, information decoding subroutines, information forwarding subroutines, and initiation subroutines. In accordance with a preferred embodiment of the present invention, the base station 140 further comprises a plurality of look-up tables 325–329 for use in decoding and correcting information received from the data port 305. Counters 330 coupled to the CPU 310 are further utilized in processing the received information.

After received information has been decoded and corrected, an encoder 335 is utilized to encode data which is to be transmitted to the portable devices 105 (FIG. 1) located within the coverage area of the base station 140. The encoder 335, for example, can encode the data using any of a variety of well-known paging formats, such as the POCSAG (Post Office Code Standardization Advisory Group) signalling format or the GSC (Golay Sequential Code) signalling format. Thereafter, the encoded data is provided to a transmitter 340 for transmitting the data at a predetermined frequency in a manner well known to one of ordinary skill in the art.

In accordance with the preferred embodiment of the present invention, the base station 140, unlike prior art devices, receives a codeword of known length n, then divides the codeword into a number of segments prior to decoding the codeword for error correction purposes. The segments, rather than individual bits, are then processed to determine a resulting syndrome from which an erroneous bit can be determined. In general, this "multi-bit" method of error correction involves the division of a codeword into several multi-bit segments. The bit combinations of each segment are then used as indices into look-up tables 326–329, which include all possible bit combinations and the syndromes pre-calculated therefor. The syndromes corresponding to the bit combination of each segment are then added, using modulo 2 arithmetic, to form a resulting syndrome which can be used as an index into the inverse look-up table 325 to detect the erroneous bit. The inverse look-up table 325 can be equivalent to Table 2 described above.

The transmitter 335 and encoder 340 are both well known elements and can be implemented using a variety of conventional software and hardware elements. The CPU 310, RAM 315, ROM 320, counters 330, and look-up tables 325–329 can be implemented using a microcomputer, such as an MC68302 microcomputer manufactured by Motorola, Inc. of Schaumburg, Ill. Alternatively, hard-wired logic or other processing devices capable of performing equivalent operations may be utilized as well.

In this manner, according to the present invention, the number of comparison, i.e., indexing, and addition steps necessary to calculate the running syndrome is conveniently limited to the number of segments into which the codeword is divided. As a result, the resulting syndrome can be calculated much more quickly than in conventional base station decoding processes, and data can be forwarded through the base station 140 more quickly.

In accordance with the preferred embodiment of the present invention, the running syndrome is calculated for multi-bit segments of the codeword to speed up processing. However, there is a trade-off between processing speed and memory requirements. As the number of bits processed at once becomes greater, the number of entries included in the look-up tables 326–329 becomes greater.

For instance, the entire codeword could be processed at once, but this would require the pre-calculation and storage of $2^{31}$ entries in a look-up table. For practical use, therefore, a greater number of segments is preferable. If, for instance, a thirty-one (31) bit codeword is split into one seven-bit and three 8-bit segments, one look-up table of one-hundred-twenty-eight ($2^7$) entries and three look-up tables of two-hundred-fifty-six ($2^8$) entries are required. If the number of segments is reduced to three segments, i.e., one eleven-bit segment and two ten-bit segments, one table of 2,048 entries and two tables of 1,024 entries are required. So, the table memory required increases from 896 to 3,072 entries when the codeword is processed as three rather than four segments. However, the decoding of a codeword split into three segments is faster than the decoding of a codeword split into four segments. It can be seen, therefore, that a codeword which has been split into segments in accordance with the present invention can be processed much faster than codewords processed using conventional decoding methods, which analyze each individual bit separately.

For illustrative purposes, the tables which would be utilized when the codeword is divided into four segments, e.g., three 8-bit segments and one 7-bit segment, are depicted below.

| Error correction table, in binary, for segment 1 (codeword bits 0–7) | | | | | | | | | | |
|---|---|---|---|---|---|---|---|---|---|---|
| Offset | 0 | 1 | 2 | 3 | 4 | 5 | 6 | 7 | 8 | 9 |
| 0 | 00000 | 00001 | 00010 | 00011 | 00100 | 00101 | 00110 | 00111 | 01000 | 01001 |
| 10 | 01010 | 01011 | 01100 | 01101 | 01110 | 01111 | 10000 | 10001 | 10010 | 10011 |
| 20 | 10100 | 10101 | 10110 | 10111 | 11000 | 11001 | 11010 | 11011 | 11100 | 11101 |
| 30 | 11110 | 11111 | 00101 | 00100 | 00111 | 00110 | 00001 | 00000 | 00011 | 00010 |
| 40 | 01101 | 01100 | 01111 | 01110 | 01001 | 01000 | 01011 | 01010 | 10101 | 10100 |
| 50 | 10111 | 10110 | 10001 | 10000 | 10011 | 10010 | 11101 | 11100 | 11111 | 11110 |
| 60 | 11001 | 11000 | 11011 | 11010 | 01010 | 01011 | 01000 | 01001 | 01110 | 01111 |
| 70 | 01100 | 01101 | 00010 | 00011 | 00000 | 00001 | 00110 | 00111 | 00100 | 00101 |
| 80 | 11010 | 11011 | 11000 | 11001 | 11110 | 11111 | 11100 | 11101 | 10010 | 10011 |
| 90 | 10000 | 10001 | 10110 | 10111 | 10100 | 10101 | 01111 | 01110 | 01101 | 01100 |
| 100 | 01000 | 01010 | 01001 | 01000 | 00111 | 00110 | 00101 | 00100 | 00011 | 00010 |
| 110 | 00001 | 00000 | 11111 | 11110 | 11101 | 11100 | 11011 | 11010 | 11001 | 11000 |
| 120 | 10111 | 10110 | 10101 | 10100 | 10011 | 10010 | 10001 | 10000 | 10100 | 10101 |
| 130 | 10110 | 10111 | 10000 | 10001 | 10010 | 10011 | 11100 | 11101 | 11110 | 11111 |
| 140 | 11000 | 11001 | 11010 | 11011 | 00100 | 00101 | 00110 | 00111 | 00000 | 00001 |
| 150 | 00010 | 00011 | 01100 | 01101 | 01110 | 01111 | 01000 | 01001 | 01010 | 01011 |
| 160 | 10001 | 10000 | 10011 | 10010 | 10101 | 10100 | 10111 | 10110 | 11001 | 11000 |
| 170 | 11011 | 11010 | 11101 | 11100 | 11111 | 11110 | 00001 | 00000 | 00011 | 00010 |
| 180 | 00101 | 00100 | 00111 | 00110 | 01001 | 01000 | 01011 | 01010 | 01101 | 01100 |
| 190 | 01111 | 01110 | 11110 | 11111 | 11100 | 11101 | 11010 | 11011 | 11000 | 11001 |
| 200 | 10110 | 10111 | 10100 | 10101 | 10010 | 10011 | 10000 | 10001 | 01110 | 01111 |
| 210 | 01100 | 01101 | 01010 | 01011 | 01000 | 01001 | 00110 | 00111 | 00100 | 00101 |
| 220 | 00010 | 00011 | 00000 | 00001 | 11011 | 11010 | 11001 | 11000 | 11111 | 11110 |
| 230 | 11101 | 11100 | 10011 | 10010 | 10001 | 10000 | 10111 | 10110 | 10101 | 10100 |
| 240 | 01011 | 01010 | 01001 | 01000 | 01111 | 01110 | 01101 | 01100 | 00011 | 00010 |
| 250 | 00001 | 00000 | 00111 | 00110 | 00101 | 00100 | | | | |

| Error correction table, in binary, for segment 2 (codeword bits 8–15) | | | | | | | | | | |
|---|---|---|---|---|---|---|---|---|---|---|
| Offset | 0 | 1 | 2 | 3 | 4 | 5 | 6 | 7 | 8 | 9 |
| 0 | 00000 | 01101 | 11010 | 10111 | 10001 | 11100 | 01011 | 00110 | 00111 | 01010 |
| 10 | 11101 | 10000 | 10110 | 11011 | 01100 | 00001 | 01110 | 00011 | 10100 | 11001 |
| 20 | 11111 | 10010 | 00101 | 01000 | 01001 | 00100 | 10011 | 11110 | 11000 | 10101 |
| 30 | 00010 | 01111 | 11100 | 10001 | 00110 | 01011 | 01101 | 00000 | 10111 | 11010 |
| 40 | 11011 | 10110 | 00001 | 01100 | 01010 | 00111 | 10000 | 11101 | 10010 | 11111 |
| 50 | 01000 | 00101 | 00011 | 01110 | 11001 | 10100 | 10101 | 11000 | 01111 | 00010 |
| 60 | 00100 | 01001 | 11110 | 10011 | 11101 | 10000 | 00111 | 01010 | 01100 | 00001 |
| 70 | 10110 | 11011 | 11010 | 10111 | 00000 | 01101 | 01011 | 00110 | 10001 | 11100 |
| 80 | 10011 | 11110 | 01001 | 00100 | 00010 | 01111 | 11000 | 10101 | 10100 | 11001 |
| 90 | 01110 | 00011 | 00101 | 01000 | 11111 | 10010 | 00001 | 01100 | 11011 | 10110 |
| 100 | 10000 | 11101 | 01010 | 00111 | 00110 | 01011 | 11100 | 10001 | 10111 | 11010 |
| 110 | 01101 | 00000 | 01111 | 00010 | 10101 | 11000 | 11110 | 10011 | 00100 | 01001 |
| 120 | 01000 | 00101 | 10010 | 11111 | 11001 | 10100 | 00011 | 01110 | 11111 | 10010 |
| 130 | 00101 | 01000 | 01110 | 00011 | 10100 | 11001 | 11000 | 10101 | 00010 | 01111 |
| 140 | 01001 | 00100 | 10011 | 11110 | 10001 | 11100 | 01011 | 00110 | 00000 | 01101 |
| 150 | 11010 | 10111 | 10110 | 11011 | 01100 | 00001 | 00111 | 01010 | 00100 | 01001 |
| 160 | 00011 | 01110 | 11001 | 10100 | 10010 | 11111 | 01000 | 00101 | 00100 | 01001 |
| 170 | 11110 | 10011 | 10101 | 11000 | 01111 | 00010 | 00010 | 00000 | 10111 | 11010 |
| 180 | 11100 | 10001 | 00110 | 01011 | 00110 | 00111 | 10000 | 11101 | 11011 | 10110 |
| 190 | 00001 | 01100 | 00010 | 01111 | 11000 | 10101 | 10011 | 11110 | 01001 | 00100 |
| 200 | 00101 | 01000 | 11111 | 10010 | 10100 | 11001 | 01110 | 00011 | 01100 | 00001 |
| 210 | 10110 | 11011 | 11101 | 10000 | 00111 | 01010 | 01011 | 00110 | 11101 | 11100 |
| 220 | 11010 | 10111 | 00000 | 01101 | 11110 | 10011 | 00100 | 01001 | 01111 | 00010 |
| 230 | 10101 | 11000 | 11001 | 10100 | 00011 | 01110 | 01000 | 00101 | 10010 | 11111 |
| 240 | 10000 | 11101 | 01010 | 00111 | 00001 | 01100 | 11011 | 10110 | 10111 | 11010 |
| 250 | 01101 | 00000 | 00110 | 01011 | 11100 | 10001 | | | | |

| Error correction table, in binary, for segment 3 (codeword bits 16–23) | | | | | | | | | | |
|---|---|---|---|---|---|---|---|---|---|---|
| Offset | 0 | 1 | 2 | 3 | 4 | 5 | 6 | 7 | 8 | 9 |
| 0 | 00000 | 11011 | 10011 | 01000 | 00011 | 11000 | 10000 | 01011 | 00110 | 11101 |
| 10 | 10101 | 01110 | 00101 | 11110 | 10110 | 01101 | 01100 | 10111 | 11111 | 00100 |
| 20 | 01111 | 10100 | 11100 | 00111 | 01010 | 10001 | 11001 | 00010 | 01001 | 10010 |
| 30 | 11010 | 00001 | 11000 | 00011 | 01011 | 10000 | 11011 | 00000 | 01000 | 10011 |
| 40 | 11110 | 00101 | 01101 | 10110 | 11101 | 00110 | 01110 | 10101 | 10100 | 01111 |
| 50 | 00111 | 11100 | 10111 | 01100 | 00100 | 11111 | 10010 | 01001 | 00001 | 11010 |
| 60 | 10001 | 01010 | 00010 | 11001 | 10101 | 01110 | 00110 | 11101 | 10110 | 01101 |
| 70 | 00101 | 11110 | 10011 | 01000 | 00000 | 11011 | 10000 | 01011 | 00011 | 11000 |
| 80 | 11001 | 00010 | 01010 | 10001 | 11010 | 00001 | 01001 | 10010 | 11111 | 00100 |

-continued

| Error correction table, in binary, for segment 3 (codeword bits 16–23) | | | | | | | | | | |
|---|---|---|---|---|---|---|---|---|---|---|
| Offset | 0 | 1 | 2 | 3 | 4 | 5 | 6 | 7 | 8 | 9 |
| 90 | 01100 | 10111 | 11100 | 00111 | 01111 | 10100 | 01101 | 10110 | 11110 | 00101 |
| 100 | 01110 | 10101 | 11101 | 00110 | 01011 | 10000 | 11000 | 00011 | 01000 | 10011 |
| 110 | 11011 | 00000 | 00001 | 11010 | 10010 | 01001 | 00010 | 11001 | 10001 | 01010 |
| 120 | 00111 | 11100 | 10100 | 01111 | 00100 | 11111 | 10111 | 01100 | 01111 | 10100 |
| 130 | 11100 | 00111 | 01100 | 10111 | 11111 | 00100 | 01001 | 10010 | 11010 | 00001 |
| 140 | 01010 | 10001 | 11001 | 00010 | 00011 | 11000 | 10000 | 01011 | 00000 | 11011 |
| 150 | 10011 | 01000 | 00101 | 11110 | 10110 | 01101 | 00110 | 11101 | 10101 | 01110 |
| 160 | 10111 | 01100 | 00100 | 11111 | 10100 | 01111 | 00111 | 11100 | 10001 | 01110 |
| 170 | 00010 | 11001 | 10010 | 01001 | 00001 | 11010 | 11011 | 00000 | 01000 | 10011 |
| 180 | 11000 | 00011 | 01011 | 10000 | 11101 | 00110 | 01110 | 10101 | 11110 | 00101 |
| 190 | 01101 | 10010 | 11010 | 00001 | 01001 | 10010 | 11001 | 00010 | 01010 | 10001 |
| 200 | 11100 | 00111 | 01111 | 10100 | 11111 | 00100 | 01100 | 10111 | 10110 | 01101 |
| 210 | 00101 | 11110 | 10101 | 01110 | 00110 | 11101 | 10000 | 01011 | 00011 | 11000 |
| 220 | 10011 | 01000 | 00000 | 11011 | 00010 | 11001 | 10001 | 01010 | 00001 | 11010 |
| 230 | 10010 | 01001 | 00100 | 11111 | 10111 | 01100 | 00111 | 11100 | 10100 | 01111 |
| 240 | 01110 | 10101 | 11101 | 00110 | 01101 | 10110 | 11110 | 00101 | 01000 | 10011 |
| 250 | 11011 | 00000 | 01011 | 10000 | 11000 | 00011 | | | | |

| Error correction table, in binary, for segment 4 (codeword bits 24–30) | | | | | | | | | | |
|---|---|---|---|---|---|---|---|---|---|---|
| Offset | 0 | 1 | 2 | 3 | 4 | 5 | 6 | 7 | 8 | 9 |
| 0 | 00000 | 11110 | 11001 | 00111 | 10111 | 01001 | 01110 | 10000 | 01011 | 10101 |
| 10 | 10010 | 01100 | 11100 | 00010 | 00101 | 11011 | 10110 | 01000 | 01111 | 10001 |
| 20 | 00001 | 11111 | 11000 | 00110 | 11101 | 00011 | 00100 | 11010 | 01010 | 10100 |
| 30 | 10011 | 01101 | 01001 | 10111 | 10000 | 01110 | 11110 | 00000 | 00111 | 11001 |
| 40 | 00010 | 11100 | 11011 | 00101 | 10101 | 01011 | 01100 | 10010 | 11111 | 00001 |
| 50 | 00110 | 11000 | 01000 | 10110 | 10001 | 01111 | 10100 | 01010 | 01101 | 10011 |
| 60 | 00011 | 11101 | 11010 | 00100 | 10010 | 01100 | 01011 | 10101 | 00101 | 11011 |
| 70 | 11100 | 00010 | 11001 | 00111 | 00000 | 11110 | 01110 | 10000 | 10111 | 01001 |
| 80 | 00100 | 11010 | 11101 | 00011 | 10011 | 01101 | 01010 | 10100 | 01111 | 10001 |
| 90 | 10110 | 01000 | 11000 | 00110 | 00001 | 11111 | 11011 | 00101 | 00010 | 11100 |
| 100 | 01100 | 10010 | 10101 | 01011 | 10000 | 01110 | 01001 | 10111 | 00111 | 11001 |
| 110 | 11110 | 00000 | 01101 | 10011 | 10100 | 01010 | 11010 | 00100 | 00011 | 11101 |
| 120 | 00110 | 11000 | 11111 | 00001 | 10001 | 01111 | 01000 | 10110 | | |

The "offset" in each table simply provides a simple method for tabulating the large number of table entries. An entry can be located by adding the vertical and horizontal offsets. For example, the fourteenth (14) element is located across from the "ten" in the offset column and beneath the "four" in the offset row. Additionally, this fourteenth element is equivalent to the fourteenth possible bit combination when the bit combinations are sequentially determined.

Figure 4:
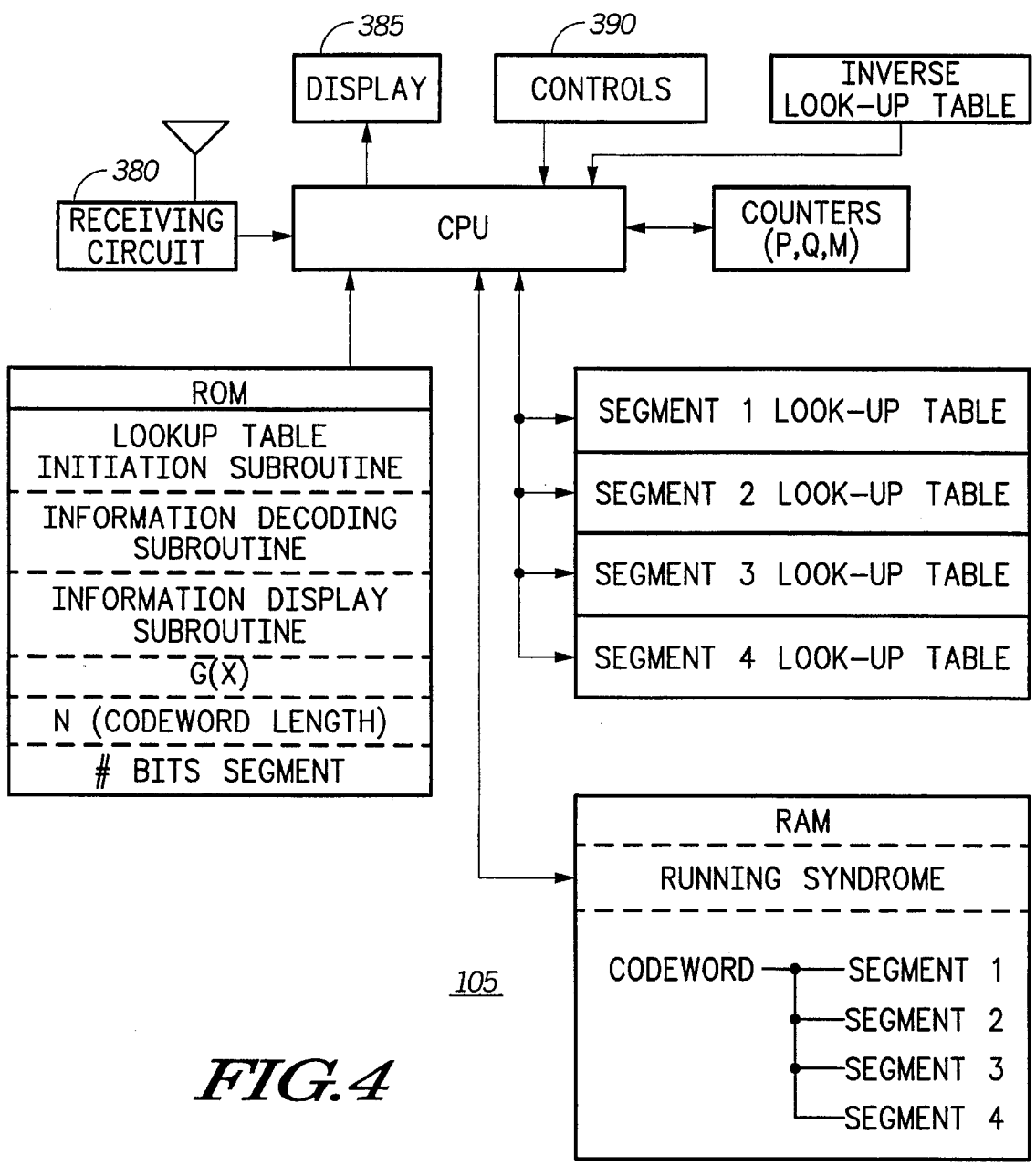
FIG. 4 is an electrical block diagram of a portable radio device included in the radio communication system of FIG. 1 for decoding the codewords generated by the system controller of FIG. 2 in accordance with an alternate embodiment of the present invention.

Although the decoding process in accordance with the present invention is preferably embodied in the base station 140, other communication devices may benefit from the use of the present decoding process as well. For example, a system monitoring device can receive signals from a base station, decode them in accordance with the present invention, and alert the system controller when signals are being received erroneously. Also, portable radio devices 105, e.g., paging receivers, such as the one depicted in the block diagram of FIG. 4 can also use the multi-bit decoding process. The portable radio device 105 operates in a similar manner. However, rather than receiving the information via a data port, the portable radio device 105 preferably includes a receiving circuit 380 for demodulating a received RF signal including a codeword. Additionally, once the codeword has been corrected according to the present invention, the message information included therein can be directly presented to the user on a presentation device, such as a display 385 or a transducer (not shown). The display of the message can be either automatic or responsive to user manipulation of controls 390.

Figure 5:
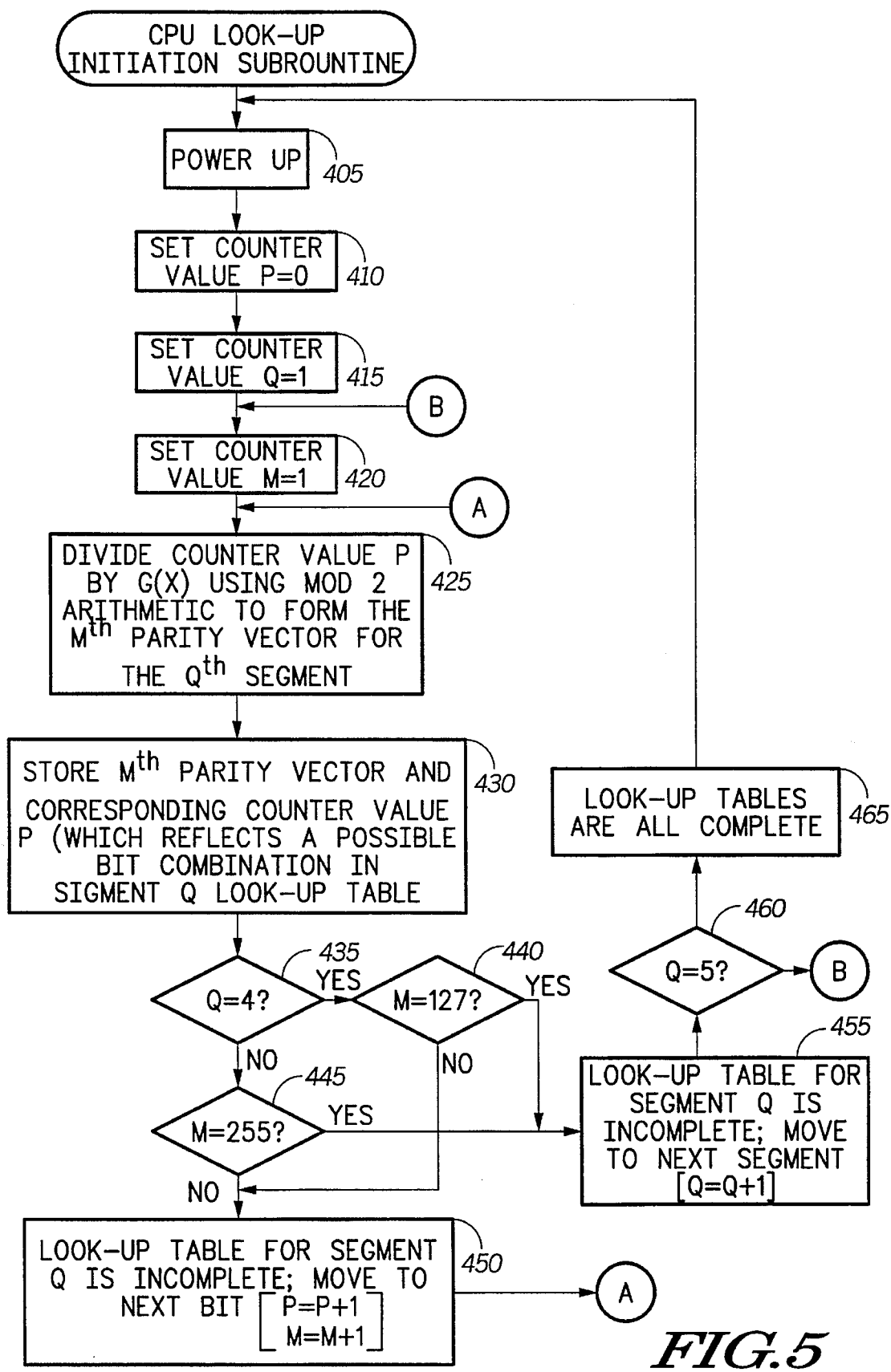
FIG. 5 is a flowchart depicting a look-up table initiation subroutine performed by a processing unit included in the base station of FIG. 3 in accordance with the preferred embodiment of the present invention.

Referring next to FIG. 5, a flowchart depicts the operation of the CPU 310, in accordance with the preferred embodiment of the present invention, when initializing the segment look-up tables 326–329 for a thirty-one bit codeword divided into four segments, three of which include eight bits and one of which includes only seven bits. It will be appreciated, however, that the choice of four segments of a thirty-one bit codeword is for illustrative purposes only and that other choices of bits, segments, and codewords may be calculated in a similar manner. After power up, at step 405, counter value p is set equal to zero, i.e., p=0, and counter values q and m are set equal to one, i.e., q=1 and m=1, at steps 410, 415, 420. Next, at step 425, the CPU 310 divides, using modulo 2 arithmetic, the counter value p by the generator polynomial g(x), i.e., p÷g(x), to form the mth parity vector for the segment q look-up table. The mth parity vector and corresponding counter value p, which reflects a possible bit combination in its binary form, are stored in the segment q look-up table, at step 430.

After storing the entry, the CPU 310 determines, at step 435, whether q is equal to four, i.e., q=4. When q=4, the CPU 310 then determines, at step 440, whether counter value m is equal to one-hundred-twenty-seven, i.e., m=127. When q≠4, the CPU 310 determines, at step 445, whether m=255. When, for the appropriate values of q, counter value m is not equal either to one-hundred-twenty-seven or to two-hundred-fifty-five, i.e., m≠127 or 255, indicating that the look-up table for the current segment (segment q) is incomplete, both p and m are incremented, i.e., p=p+1 and m=m+1. Processing then moves to the next bit combination and resumes at step 425. This continues until parity vectors for each bit combination of the current segment are calculated.

When q=4 and m=127, or when q≠4 and m=255, all possible bit combinations for the current segment (segment q) have been processed and the segment q look-up table is complete; so, at step 455, counter value q is incremented, i.e., q=q+1. The CPU 310 then determines, at step 460, whether q=5, indicating that look-up tables for all of the segments have been completed. When q<5, indicating that further look-up tables must be created, processing returns to step 420 and counter value m is reinitialized to one, i.e., m=1. The parity vectors for each bit combination included in the next segment are then calculated and stored in a look-up table corresponding to that segment.

When, at step 465, all look-up tables have been created, i.e., when q=5, the look-up table initiation subroutine is complete and no further calculations for the tables 326–329 are necessary.

Figure 6:
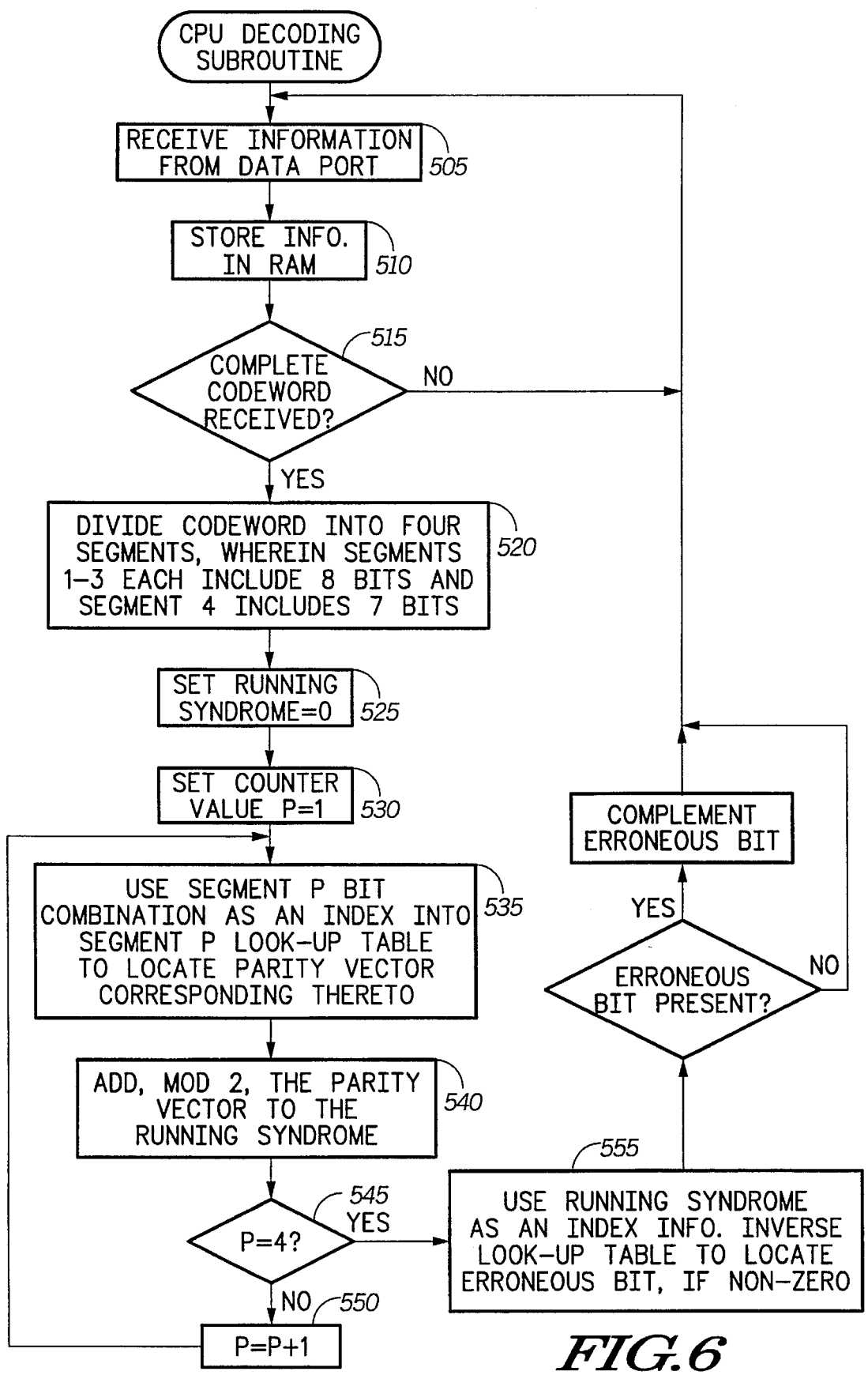
FIG. 6 is a flowchart depicting an information decoding subroutine performed by the processing unit included in the base station of FIG. 3 in accordance with the preferred embodiment of the present invention.

FIG. 6 is a flowchart illustrating the decoding operation of the CPU 310 in accordance with the preferred embodiment of the present invention. When information is received, at step 505, from the data port 305 (FIG. 3), the information is stored, at step 510, in the RAM 315. When a complete codeword is received, at step 515, the codeword is divided, at step 520, into a predetermined number of segments. For the present example, a thirty-one bit codeword is divided into four segments, three of which include eight bits and one of which includes seven bits. Additionally, the running syndrome is set, at step 525, to an initial value of zero, and counter value p is set, at step 530, to a value of one, i.e., p=1. Next, the segment p bit combination is used, at step 535, as an index into the segment p look-up table to locate the parity vector corresponding thereto. The parity vector is added, at step 540, to the running syndrome using modulo 2 arithmetic.

The CPU 310 subsequently determines, at step 545, whether the counter value p is equal to four, i.e., when p is equal to the number of segments. When p≠4, the counter value is incremented, at step 550, and processing returns to step 535 for the determination of a next segment parity vector. When the bit combinations of all segments have been utilized to locate the corresponding parity vectors, and when all of the parity vectors have been added, modulo 2, to the running syndrome, the resulting syndrome can be used for error-correcting the codeword.

The CPU 310 then uses, at step 555, the resulting syndrome as an index into the inverse look-up table to locate the value indicative of the erroneous bit, if present. When a bit of the codeword is, at step 560, erroneous, the erroneous bit is simply complemented, at step 565. In this manner, an erroneous bit included in a codeword can be detected and corrected very quickly.

Figure 7:
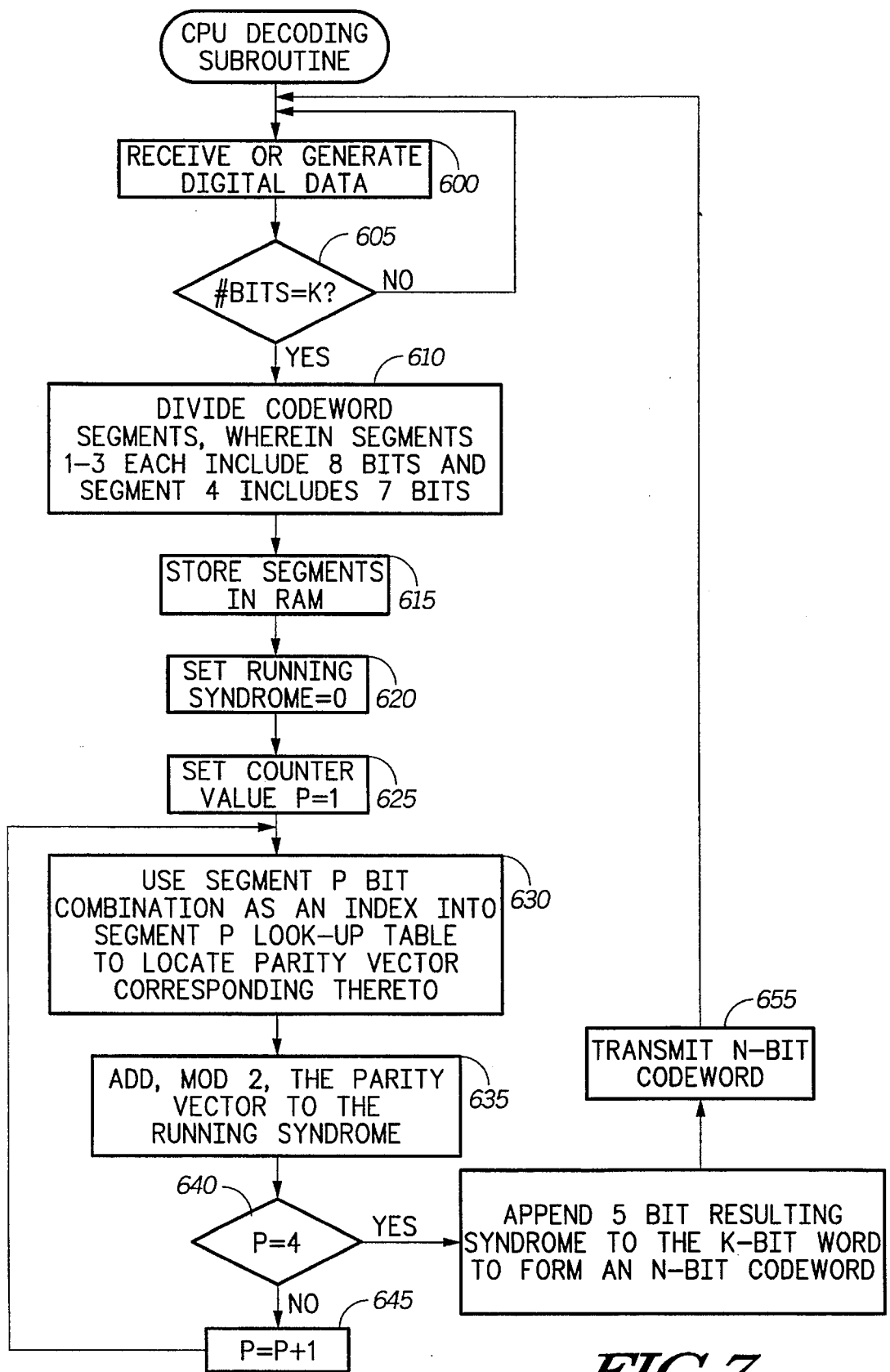
FIG. 7 is a flowchart depicting an information encoding subroutine performed by the processing unit included in the base station of FIG. 3 in accordance with the preferred embodiment of the present invention.

Referring next to FIG. 3 in conjunction with FIG. 7, a flowchart depicts an encoding process which operates in a manner similar to the process (FIG. 6) for decoding codewords. In accordance with the present invention, at step 600, the CPU 310 (FIG. 3) of the base station 140, or other transmitting device, receives or generates a word comprising k bits. For illustrative purposes only, the flowchart depicted in FIG. 7 illustrates the encoding of a (31, 26) BCH codeword, although it will be appreciated that other types of codewords, such as (31, 21) BCH, can be encoded using this process as well. Therefore, for the present example, k=26. When, at step 605, k bits have been formed into a word, five zeroes, i.e., null data, are appended to the k-bit word, and the word with the appended zeroes is divided, at step 610, into a number of segments, e.g., three segments of 8 bits each and one segment of 7 bits, which are preferably stored, at step 615, in the RAM 315 (FIG. 3).

Next, the CPU 310 preferably sets the running syndrome equal to zero, at step 620, and initializes the counter value p to one, i.e., p=1, at step 625. The current segment p bit combination is then, at step 630, used as an index into the segment p look-up table to locate the parity vector corresponding thereto. This parity vector, at step 635, is added to the running syndrome using modulo 2 arithmetic. When, at step 640, p is not equal to four, i.e., the number of segments, counter value p is incremented, at step 645, and operation continues at step 630.

When p=4, all segments have been processed, and the resulting syndrome stored in the RAM 315 is appended to the 26-bit word to form a (31, 26) BCH codeword, at step 650. At this step, the five zeroes are actually replaced with the resulting syndrome. This codeword is then transmitted, at step 650, to another receiving device, such as the radio receivers 105 (FIG. 1).

It will be appreciated that, as mentioned above, other types of information forwarding devices, rather than the base station 140, can benefit from the use of the present encoding process, which can be performed more rapidly than conventional encoding processes. As a result, data transfer is not delayed by the process according to the present invention because less encoding steps are required.

In summary, the base station as described above receives a codeword of predetermined length from another device, which has previously included error correction bits in the codeword. In accordance with the preferred embodiment of the present invention, the base station then divides the codeword into a number of segments having multiple bits. These segments are each processed as a whole to determine, from previously calculated look-up tables, syndromes corresponding to the segments. The small number of syndromes are subsequently added, modulo 2, to generate a resulting syndrome. The resulting syndrome is used to identify an erroneous bit when an inverse look-up table is referenced for decoding purposes. When the encoding process is performed, the resulting syndrome is appended to a k-bit word to form an n-bit codeword, such as a (31, 26) BCH codeword.

In conventional encoding and decoding processes, on the other hand, each bit of a codeword is processed separately and individually. Therefore, comparison, i.e., indexing, and addition steps must be performed for each bit in the codeword, and the encoding/decoding process can be very time consuming. As a result, the speed with which data can be transferred from a system controller to portable devices, through the base station, is very slow in conventional radio communication systems.

It may be appreciated by now that there has been provided a method and apparatus for more quickly encoding, decoding, and error-correcting information provided to an information processing device, such as a base station.

What is claimed is:

1. A method, in a communication device for receiving data, for decoding a codeword of predetermined length which has been previously encoded with parity bits and information bits, the method comprising the steps of:

(a) dividing the codeword into segments, wherein the segments comprise multiple bits forming bit combinations;

(b) using the bit combinations as indices to locate parity vectors corresponding to the bit combinations;

(c) adding the parity vectors using modulo 2 arithmetic to form a resulting syndrome; and (d) using the resulting syndrome as an index to locate a corresponding value indicative of an erroneous bit included in the codeword.

2. The method according to claim 1, further comprising the step of:

(e) correcting the codeword by complementing the erroneous bit.

3. The method according to claim 1, wherein step (b) comprises the step of:

(f) using the bit combinations of the segments as indices to locate parity vectors corresponding to the bit combinations, wherein the number of parity vectors is equivalent to the number of bit combinations.

4. The method according to claim 1, further comprising, prior to step (a), the step of:

(g) generating stored values corresponding to the bit combinations by dividing the bit combinations by a generator polynomial using modulo 2 arithmetic.

5. The method according to claim 4, wherein step (a) comprises the step of:

(h) dividing the codeword into first, second, third, and fourth segments, wherein the first, second, and third segments each comprise eight bits and the fourth segment comprises seven bits, and wherein the first, second, third, and fourth segments comprise bit combinations.

6. The method according to claim 5, wherein step (g) comprises the steps of:

(i) generating a first look-up table including a first set of parity vectors corresponding to each possible bit combination of the first segment;

(j) generating a second look-up table including a second set of parity vectors corresponding to each possible bit combination of the second segment;

(k) generating a third look-up table including a third set of parity vectors corresponding to each possible bit combination of the third segment; and (l) generating a fourth look-up table including a fourth set of parity vectors corresponding to each possible bit combination of the fourth segment.

7. A communication device for receiving and decoding a codeword of predetermined length, wherein the codeword includes information and parity bits, the communication device comprising:

a memory for storing the codeword in the form of segments, wherein each segment comprises multiple bits forming bit combinations;

a first look-up table for storing parity vectors corresponding to the bit combinations;

a second look-up table for storing values corresponding to syndrome vectors; and a processing unit coupled to the memory and the first and second look-up tables for using the bit combinations of the segments as indices into the first look-up table to locate corresponding parity vectors, adding the corresponding parity vectors using modulo 2 arithmetic to form a resulting syndrome, and using the resulting syndrome as an index into the second look-up table to locate an erroneous bit included in the codeword.

8. The communication device according to claim 7, wherein the processing unit comprises complementing means for complementing the erroneous bit to correct the codeword.

9. The communication device according to claim 7, further comprising initializing means for generating the parity vectors included in the look-up tables by dividing the bit combinations by a generator polynomial using modulo 2 arithmetic.

10. The communication device according to claim 7, wherein the codeword is divided into first, second, third, and fourth segments, and wherein the first, second, and third segments each comprise eight bits and the fourth bit comprises seven bits.

11. The communication device according to claim 10, wherein the first look-up table comprises a first set of parity vectors corresponding to each possible bit combination of the first segment, a second set of parity vectors corresponding to each possible bit combination of the second segment, a third set of parity vectors corresponding to each possible bit combination of the third segment, and a fourth set of parity vectors corresponding to each possible bit combination of the fourth segment.

12. The communication device according to claim 7, wherein the communication device comprises a base station, the base station further comprising:

a data port coupled to the processing unit for receiving the codeword; and a transmitter coupled to the processing unit for transmitting the information bits, after error correction, as a radio frequency signal.

13. The communication device according to claim 7, wherein the communication device comprises a portable radio device, the portable radio device further comprising:

a receiving circuit coupled to the processing unit for receiving a radio frequency signal and recovering therefrom the codeword; and a presentation device coupled to the processing unit for presenting the information included in the codeword to a user after error correction.

14. A communication system providing for error correction of received information, the communication system comprising:

a controller for encoding information bits and parity bits to form a codeword of predetermined length; and a communication device coupled to the controller for receiving the codeword from the controller over a communication link and subsequently error correcting the codeword, the communication device comprising:

a memory for storing the codeword in the form of segments, wherein each segment comprises multiple bits forming bit combinations;

a first look-up table for storing parity vectors corresponding to the bit combinations;

a second look-up table for storing values corresponding to syndrome vectors; and a processing unit coupled to the memory and the first and second look-up tables for using the bit combinations of the segments as indices into the first look-up table to locate corresponding parity vectors, adding the corresponding parity vectors using modulo 2 arithmetic to form a resulting syndrome, and using the resulting syndrome as an index into the second look-up table to locate an erroneous bit included in the codeword.

15. The communication system according to claim 14, wherein the processing unit comprises complementing means for complementing the erroneous bit to correct the codeword.

16. The communication system according to claim 15, wherein:

the communication device comprises a base station;

the base station further comprises:

a data port coupled to the processing unit for receiving the codeword; and a transmitter coupled to the processing unit for transmitting the information bits, after error correction, as a radio frequency signal; and the communication system further comprises a plurality of portable radio devices for receiving the radio frequency signal from the base station.

17. The communication system according to claim 15, wherein the communication device is a portable radio device, the portable radio device further comprising:

a receiving circuit coupled to the processing unit for receiving a radio frequency signal and recovering therefrom the codeword; and a presentation device coupled to the processing unit for presenting the information included in the codeword to a user after error correction.

18. A communication device for encoding a codeword of predetermined length, wherein the codeword includes information and parity bits, the communication device comprising:

a memory for storing digital data in the form of segments, wherein each segment comprises multiple bits forming bit combinations;

a look-up table for storing parity vectors corresponding to the bit combinations; and a processing unit coupled to the memory and the look-up table for using the bit combinations of the segments as indices into the look-up table to locate corresponding parity vectors, adding the corresponding parity vectors using modulo 2 arithmetic to form a resulting syndrome, and appending the resulting syndrome to the digital data to form the codeword.

19. The communication device according to claim 18, further comprising appending means for appending null data to the digital data prior to storing the digital data in the form of the segments.

20. A communication system providing for error correction of received information, the communication system comprising:

a transmitting device for appending parity bits to information bits to form a codeword of predetermined length and for transmitting the codeword, the transmitting device comprising:

appending means for appending null data to the information bits;

a memory for storing the information bits, including the null data, in the form of segments, wherein each segment comprises multiple bits forming bit combinations;

a look-up table for storing parity vectors corresponding to the bit combinations; and a processing unit coupled to the memory and the look-up table for using the bit combinations of the segments as indices into the look-up table to locate corresponding parity vectors, adding the corresponding parity vectors using modulo 2 arithmetic to form a resulting syndrome, and replacing the null data with the resulting syndrome to form the codeword; and a communication device coupled to the controller for receiving the codeword from the controller over a communication link and subsequently error correcting the codeword.

21. The communication system according to claim 20, wherein:

the transmitting device comprises a base station, which further comprises:

a data port coupled to the processing unit for receiving the information bits; and a transmitter coupled to the processing unit for transmitting the codeword as a radio frequency signal; and the communication device comprises a portable radio device for receiving the radio frequency signal from the base station.

\* \* \* \* \*